US008350462B2

(12) United States Patent
Leatherdale et al.

(10) Patent No.: US 8,350,462 B2
(45) Date of Patent: Jan. 8, 2013

(54) LIGHT GENERATING DEVICE HAVING DOUBLE-SIDED WAVELENGTH CONVERTER

(75) Inventors: Catherine A. Leatherdale, Woodbury, MN (US); Andrew J. Ouderkirk, Grande Garden (SG); Tommie W. Kelley, Shoreview, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 13/141,638

(22) PCT Filed: Dec. 10, 2009

(86) PCT No.: PCT/US2009/067489
§ 371 (c)(1),
(2), (4) Date: Jun. 22, 2011

(87) PCT Pub. No.: WO2010/074987
PCT Pub. Date: Jul. 1, 2010

(65) Prior Publication Data
US 2011/0260601 A1    Oct. 27, 2011

Related U.S. Application Data

(60) Provisional application No. 61/140,697, filed on Dec. 24, 2008.

(51) Int. Cl.
*H05B 33/14* (2006.01)
(52) U.S. Cl. .......... 313/501; 257/99; 257/100; 313/498; 313/512
(58) Field of Classification Search .................. 257/40, 257/72, 98–100, 642–643, 759, 9–14; 313/498–512, 313/110–117; 315/169.1, 169.3; 427/58, 427/64, 66, 532–535, 539; 428/690–691, 428/917; 438/26–29, 34, 82, 455; 445/24–25
See application file for complete search history.

(56) References Cited

U.S. PATENT DOCUMENTS
5,915,193 A    6/1999 Tong
(Continued)

FOREIGN PATENT DOCUMENTS
DE    10-2006-024165    11/2007
(Continued)

OTHER PUBLICATIONS

Tong, "Semiconductor Wafer Bonding: Science and Technology", John Wiley & Sons, New York, 1999, Chapters 4 Surface Preparation and Room-Temperature Wafter Bonding, (pp. 49 to 101) and Chapter 10 Bonding of Structured Wafers, (pp. 223 to 232).

(Continued)

*Primary Examiner* — Mariceli Santiago
*Assistant Examiner* — Donald Raleigh
(74) *Attorney, Agent, or Firm* — Kristofor L. Storvick

(57) ABSTRACT

A light emitting device includes a wavelength converter attached to a light emitting diode (LED). The wavelength converter may have etched patterns on both the first and second sides. In some embodiments the first and second sides of the converter each include a respective structure having a different width at its top than at its base. The wavelength converter may include a first photoluminescent element substantially overlying a first region of the LED without overlying a second region of the LED, while a second photoluminescent element substantially overlies the second region without overlying the first region. In some embodiments a passivation layer is disposed over the etched pattern of the first side. A window layer may be disposed between the first and second photoluminescent elements, with non-epitaxial material disposed on first and second sides of one region of the window layer.

2 Claims, 10 Drawing Sheets

U.S. PATENT DOCUMENTS

| | | |
|---|---|---|
| 6,563,133 B1 | 5/2003 | Tong |
| 7,361,938 B2 | 4/2008 | Mueller |
| 7,402,831 B2 | 7/2008 | Miller |
| 7,700,938 B2 | 4/2010 | Miller |
| 7,700,939 B2 | 4/2010 | Miller |
| 7,737,430 B2 | 6/2010 | Miller |
| 7,902,543 B2 | 3/2011 | Miller |
| 7,982,233 B2 | 7/2011 | Berben |
| 8,003,996 B2 | 8/2011 | Weyers |
| 2002/0015013 A1 | 2/2002 | Ragle |
| 2002/0074558 A1 | 6/2002 | Hata |
| 2003/0214616 A1 | 11/2003 | Komoto |
| 2005/0110034 A1* | 5/2005 | Fujiwara .......................... 257/98 |
| 2005/0156510 A1* | 7/2005 | Chua et al. .................... 313/501 |
| 2006/0124917 A1 | 6/2006 | Miller |
| 2008/0055555 A1 | 3/2008 | Nakamura |
| 2008/0128733 A1* | 6/2008 | Yoo ................................. 257/98 |
| 2008/0217639 A1 | 9/2008 | Kim |
| 2009/0101930 A1* | 4/2009 | Li ................................... 257/98 |
| 2009/0167151 A1* | 7/2009 | Kolodin et al. ............... 313/503 |
| 2009/0272998 A1 | 11/2009 | Berben |
| 2009/0321758 A1* | 12/2009 | Liu et al. ......................... 257/98 |
| 2010/0025712 A1 | 2/2010 | Weyers |
| 2010/0117997 A1 | 5/2010 | Haase |
| 2010/0283074 A1 | 11/2010 | Kelley |
| 2010/0295075 A1 | 11/2010 | Smith |
| 2011/0121319 A1 | 5/2011 | Haase |

FOREIGN PATENT DOCUMENTS

| | | |
|---|---|---|
| DE | 10-2006-059612 | 6/2008 |
| WF | WO 2009-158191 | 12/2009 |
| WO | WO 01-69692 | 9/2001 |
| WO | WO 2007-034367 | 3/2007 |
| WO | WO 2009-048704 | 4/2009 |
| WO | WO 2009-075972 | 6/2009 |
| WO | WO 2009-148717 | 12/2009 |
| WO | WO 2009-158158 | 12/2009 |

OTHER PUBLICATIONS

Written Opinion of PCT International Application No. PCT/US2009/068541, Jul. 7, 2010, 11 pages.

International Search Report for PCT/US2009/068541, mailed Jun. 30, 1010, 7 pages.

\* cited by examiner

LIGHT GENERATING DEVICE HAVING DOUBLE-SIDED WAVELENGTH CONVERTER

CROSS REFERENCE TO RELATED APPLICATIONS

This application is a national stage filing under 35 U.S.C. 371 of PCT/US2009/067489, filed on Dec. 10, 2009, which claims priority to U.S. Provisional Application No. 61/140,697, filed on Dec. 24, 2008, the disclosure of which is incorporated by reference in its/their entirety herein.

FIELD OF THE INVENTION

The invention relates to light emitting diodes, and more particularly to a light emitting diode (LED) that includes a wavelength converter for converting the wavelength of light emitted by the LED.

BACKGROUND

Illumination systems are used in many different applications, including projection display systems, backlights for liquid crystal displays and the like. Projection systems typically use one or more white light sources, such as high pressure mercury lamps. The white light beam is usually split into three primary colors, red, green and blue, and is directed to respective image forming spatial light modulators to produce an image for each primary color. The resulting primary-color image beams are combined and projected onto a projection screen for viewing.

More recently, light emitting diodes (LEDs) have been considered as an alternative to white light sources. LEDs have the potential to provide the brightness and operational lifetime that would compete with conventional light sources. Current LEDs, however, especially green emitting LEDs, are relatively inefficient.

Conventional light sources are generally bulky, inefficient in emitting one or primary colors, difficult to integrate, and tend to result in increased size and power consumption in optical systems that employ them.

Wavelength converted light emitting diodes (LEDs) are becoming increasingly important for illumination applications where there is a need for light of a color that is not normally generated by an LED, or where a single LED may be used in the production of light having a spectrum normally produced by a number of different LEDs together. One example of such an application is in the back-illumination of displays, such as liquid crystal display (LCD) computer monitors and televisions. In such applications there is a need for substantially white light to illuminate the LCD panel. One approach to generating white light with a single LED is to first generate blue light with the LED and then to convert some or all of the light to a different color. For example, where a blue-emitting LED is used as a source of white light, a portion of the blue light may be converted using a wavelength converter to yellow light. The resulting light, a combination of yellow and blue, appears white to the viewer. The color (white point) of the resulting light, however, may not be optimum for use in display devices, since the white light is the result of mixing only two different colors.

LEDs are also being used in image display systems, for example in television screens. In such applications an arrangement of individually addressable LEDs emitting red, green and blue light is used to illuminate one pixel. The relative luminance of each LED can be controlled so as to control the overall color perceived from the pixel.

There remains a need to provide inexpensive, robust and efficient LED arrays capable of covering a large area.

SUMMARY OF THE INVENTION

One embodiment of the invention is directed to a multi-layer semiconductor construction formed with a layered construction having at least three semiconductor layers grown together and having a first side and a second side. The at least three semiconductor layers comprise a first semiconductor photoluminescent element for generating light at a first converted wavelength and a second semiconductor photoluminescent element for generating light at a second converted wavelength different from the first converted wavelength. At least one of the first and second converted wavelengths is visible light. The first side of the layered construction is patterned from the first side and the second side of the layered construction is patterned from the second side.

Another embodiment of the invention is directed to a light generating device that has an electroluminescent element having an output side and a semiconductor wavelength converter having a first side and a second side. The wavelength converter is attached to the output side of the electroluminescent element. The wavelength converter has a first etched pattern on the first side and a second etched pattern on the second side.

Another embodiment of the invention is directed to a semiconductor construction formed of an integrated stack of semiconductor layers forming a first photoluminescent element and a second photoluminescent element. The first and second photoluminescent elements are capable of emitting light at first and second wavelengths respectively when illuminated by light at a common pump wavelength. The first photoluminescent element is patterned with at least a portion of the patterned first photoluminescent element having a first semiconductor structure having a different width at the top of the first semiconductor structure than at the base of the first semiconductor structure. The second photoluminescent element is patterned with at least a portion of the patterned second photoluminescent element having a second semiconductor structure having a different width at the top of the second semiconductor structure than at the base of the second semiconductor structure. Either the tops of the first and second semiconductor structures are respectively narrower than the bases of the first and second semiconductor structures or the tops of the first and second semiconductor structures are respectively wider than the bases of the first and second semiconductor structures.

Another embodiment of the invention is directed to a light emitting device that has an electroluminescent device capable of emitting light at a pump wavelength and a wavelength converter attached to the electroluminescent device. The wavelength converter has at least a first photoluminescent element and a second photoluminescent element patterned on a single semiconductor layer stack. The first and second photoluminescent elements are capable of emitting light at first and second wavelengths respectively when illuminated by light at the pump wavelength. The first photoluminescent element substantially overlies a first region of the electroluminescent device and substantially does not overlie a second region of the electroluminescent device. The second photoluminescent element substantially overlies the second region of the electroluminescent device and substantially does not the first region of the electroluminescent device.

Another embodiment of the invention is directed to a semiconductor wavelength converter having an integral stack of semiconductor layers having a first side and a second side. A first pattern is formed in a first photoluminescent element of the first side of the stack of semiconductor layers and a second pattern is formed in a second photoluminescent element of the second side of the stack of semiconductor layers. A first passivation layer is disposed over the etched pattern of the first side.

Another embodiment of the invention is directed to a semiconductor wavelength converter that has an epitaxially grown stack of semiconductor layers including first and second photoluminescent elements and a window layer disposed between the first and second photoluminescent elements. The stack has at least a first region spaced laterally from the first and second photoluminescent elements, the first region comprising the window layer and non-epitaxial material disposed on first and second sides of the window layer.

Another embodiment of the invention is directed to a light emitting device that has an electroluminescent device capable of emitting light at a pump wavelength; and a wavelength converter attached to the electroluminescent device. The wavelength converter comprises at least a first photoluminescent element patterned on a semiconductor layer stack. The first photoluminescent is capable of generating light at a first converted wavelength when illuminated by light of the pump wavelength. A window layer is disposed in the stack to one side of the first photoluminescent element. The first photoluminescent element overlies a first region of the electroluminescent device. The window layer overlies a second region of the electroluminescent device spaced laterally from the first region. The first photoluminescent element substantially does not overlie the second region.

The above summary of the present invention is not intended to describe each illustrated embodiment or every implementation of the present invention. The following figures and detailed description more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
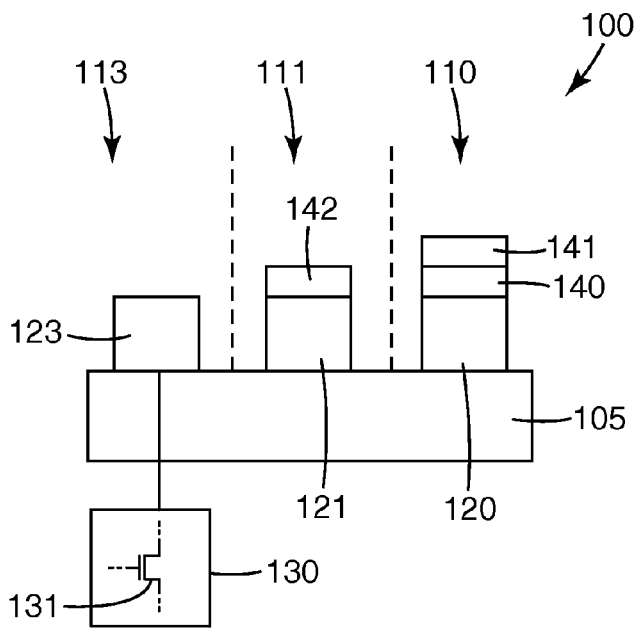
FIG. 1 schematically illustrates a side view of a light emitting system.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is applicable to light sources that incorporate a wavelength converter to convert the wavelength of at least a portion of the light originally emitted by the light source at a given wavelength into at least one additional wavelength and, in some embodiments, two additional wavelengths or more. Herein, when light is said to be at a particular wavelength, it is to be understood that the light may have a range of wavelengths, with the particular wavelength being a peak wavelength within the range of wavelengths. For example, where it is stated that light has a wavelength of $\lambda$, it should be understood that the light may comprise a range of wavelengths having $\lambda$ as the peak wavelength of the range of wavelengths. Additionally, if it is stated that the light is of a particular color, then it is to be understood that the light is perceived as that color even though it may contain components of a different color. For example, if it is stated that light is blue, the light is perceived as blue but may have a broad spectrum and may also include components that lie outside the blue region of the spectrum.

The light sources described herein can have larger or smaller light emitting regions where the output light of each region can be actively and independently controlled. The light sources can be used in, for example, a projection system to illuminate one or more pixelated image forming devices. Each light emitting region of the light source can illuminate a different portion or zone of the image forming device. Such a capability allows for efficient adaptive illumination systems where the output light intensity of a light emitting region of the light source can be actively adjusted to provide the minimum illumination required by a corresponding zone in the image forming device.

The disclosed light sources can form monochromatic (for example green or green on black) or color images. Such disclosed light sources combine the primary functions of light sources and image forming devices resulting in reduced size, power consumption, cost and the number of elements or components used in an optical system that incorporates the disclosed light sources. For example, in a display system, the disclosed light sources can function as both the light source and the image forming device, thereby eliminating or reducing the need for a backlight or a spatial modulator. As another example, incorporating the disclosed light sources in a projection system eliminates or reduces the need for image forming devices and relay optics.

Arrays of luminescent elements, such as arrays of pixels in a display system, are disclosed in which at least some of the luminescent elements include an electroluminescent device, such as a light emitting diode (LED), capable of emitting light in response to an electric signal. Some of the luminescent elements include one or more light converting elements, such as one or more potential wells and/or quantum wells, for down-converting light that is emitted by the electroluminescent devices. Down-conversion is a process that produces output light, or converted light, having a longer wavelength than the input, unconverted, light.

Arrays of luminescent elements disclosed in this application can be used in illumination systems, such as adaptive illumination systems for use in, for example, projection systems or other optical display systems.

FIG. 1 is a schematic side-view of a light emitting system 100 that includes an array of luminescent elements, such as luminescent elements 110, 111 and 113, where each element is capable of independently outputting light. Each luminescent element includes an electroluminescent device that is capable of emitting light in response to an electric signal. For example, luminescent elements 110, 111 and 113 include respective electroluminescent devices 120, 121 and 123 that may be disposed on a substrate 105.

In some cases, the luminescent elements are configured in an active matrix, meaning that at least some of the luminescent elements include respective dedicated switching circuits for driving the electroluminescent device(s) in those elements. In such cases, a luminescent element 113 may include a dedicated switching circuit 130 for driving electroluminescent device 123. The switching circuit 130 may include one or more transistors 131.

In some cases the luminescent elements may be configured as a passive matrix, meaning that the luminescent elements are not configured as an active matrix. In a passive matrix configuration, no luminescent element has a dedicated switching circuit for driving the electroluminescent device(s) in that element.

Typically, in a passive matrix configuration, the electroluminescent devices in the light emitting system are energized one row at a time. In contrast, in an active matrix configuration, although the rows are typically addressed one at a time, the switching circuits typically allow the electroluminescent devices to be energized individually. In some cases, at least some, and perhaps all, of the electroluminescent devices in light emitting system are monolithically integrated. As used herein, monolithic integration includes, but is not necessary limited to, two or more electronic devices that are manufactured on the same substrate (a common substrate) and used in an end application on the same common substrate. Monolithically integrated devices that are transferred to another substrate as a unit remain monolithically integrated. Exemplary electronic devices include LEDs, transistors, capacitors and the like.

Where portions of each of two or more elements are monolithically integrated, the two elements are considered to be monolithically integrated. For example, two luminescent elements are monolithically integrated if, for example, the electroluminescent devices in the two elements are monolithically integrated. This is so, even if, for example, the light converting element in each element is adhesively bonded to the corresponding electroluminescent device.

In cases where the electroluminescent devices include semiconductor layers, the electroluminescent devices are monolithically integrated if the devices are manufactured on the same substrate and/or if they include a common semiconductor layer. For example, where each electroluminescent device includes an n-type semiconductor layer, the devices are monolithically integrated if the n-type semiconductor layer extends across the electroluminescent devices. In such a case, the n-type semiconductor layers in the electroluminescent devices may form a continuous layer across the electroluminescent devices.

At least one luminescent element in light emitting system 100 includes one or more light converting elements for converting light emitted by the electroluminescent device(s) in the luminescent element. For example, luminescent element 110 includes light converting elements 140 and 141, and luminescent element 111 includes light converting element 142. In some cases a light converting element can be, or may include, a potential well or a quantum well.

As used herein, potential well means one or more semiconductor layers in a multilayer semiconductor structure designed to confine a carrier in one dimension only, where the semiconductor layer or layers have lower conduction band energy than surrounding layers and/or higher valence band energy than surrounding layers. The term "quantum well" generally refers to a potential well that is sufficiently thin that quantization effects increase the energy for electron-hole pair recombination in the well. A quantum well typically has a thickness of about 100 nm or less, and preferably about 10 nm or less.

In some embodiments, not all luminescent elements in the light emitting system 100 include a light converting element. For example, luminescent element 113 includes electroluminescent device 123 but does not include a light converting element. In such cases, the light output of the luminescent element and the electroluminescent device in the luminescent element have the same wavelength or spectrum.

In the context of a display system, a luminescent element can be a pixel or a sub-pixel in the light emitting system. The pixelated light emitting system can emit light at different wavelengths, for example, in the visible region of the spectrum. For example, the electroluminescent devices 120, 121, 123 in the light emitting system 100 may emit blue light. Light converting element 140 may include a blue-to-green light converting potential well absorbing the blue light emitted by the electroluminescent device 120 and emitting green light. Light converting element 141 can include a green-to-red light converting potential well absorbing the green light emitted by the light converting element 140 and emitting red light. Light converting element 142 may include a blue-to-green light converting potential well to absorb the blue light emitted by electroluminescent device 121 and thus emit green light. In such cases, elements 110, 111 and 113 output red, green and blue light respectively. In another embodiment, light converting elements 141 and 142 include a blue-to-green potential well while light converting element 140 includes a blue-to-red light converting well. In this latter case, red light generated in light converting element 140 is simply transmitted through light converting element 141.

Light emitting system 100 may efficiently output light at any desirable wavelength in, for example, the visible region of the spectrum. For example, light emitting system 100 can efficiently emit green light since the blue emitting electroluminescent devices and blue-to-green light converting elements can be highly efficient. Improved efficiency can result in reduced power consumption in an optical system that incorporates a light emitting system similar to system 100.

Light emitting system 100 can be more compact than conventional light sources. Accordingly, optical systems utilizing light emitting system 100 can be more compact, for example thinner, and have reduced weight.

In some applications, such as in a projection system or a backlight system, light emitting system 100 may function as a light source for illuminating one or more image forming devices. The light emitting system can be designed to efficiently emit, for example, a primary color or white light. The improved efficiency and the compactness of light emitting system 100 allows for improved and/or novel system designs. For example, portable battery-powered optical systems can be designed with reduced size, power consumption and weight.

In some applications, such as in projection systems, light emitting system 100 can function as both a light source and an image forming device. In such applications, conventional image forming devices such as liquid crystal display panels (LCDs) or digital micro-mirror devices (DMDs) can be eliminated from the projection system. Conventional projection systems include one or more relay optical elements for transferring light from light sources to image forming devices. The relay optics can be eliminated in a projection system that incorporates light emitting image forming device 100, thereby reducing the number of elements, size, power consumption weight and overall cost.

In general, the array of luminescent devices in light emitting system 100 can be any type array desirable in an application. In some cases, the array can be a row or column, such as a 1×n array where n is an integer greater than or equal to two. In some cases, the array may be a two-dimensional array, for example a square (m×m) array or a rectangular array (m×n) array, where m and n are both integers greater than or equal to two. In some cases the array may be a trapezoidal array, a hexagonal array or any other type of array where the relative positions of the elements are regular or irregular.

In some cases the luminescent elements in the array (or pixels in the array in the context of a display system) can be of equal size, or of different sizes, for example to account for difference in the efficiency of generating different colors.

A luminescent element in an array of luminescent elements can have any shape, such as square, oval, rectangular or more complex shapes to accommodate, for example, optical and electrical functions of a device incorporating the array. The luminescent elements in an array can be placed in any arrangement that may be desirable in an application. For example, the elements can be uniformly spaced, perhaps in a rectangular or hexagonal arrangement. In some cases the elements may be placed non-uniformly, for example to improve device performance by reducing or correcting optical aberrations such as pincushion or barrel distortions.

Figure 2:
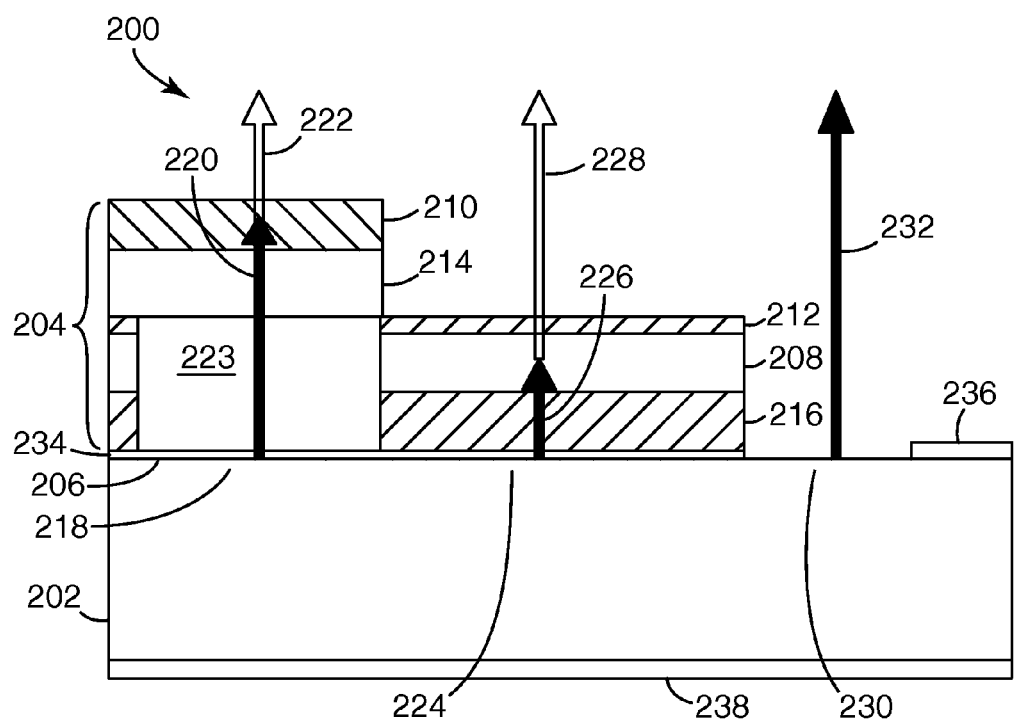
FIG. 2 schematically illustrates an embodiment of a light emitting system that uses a semiconductor wavelength converter according to principles of the present invention.

An example of a wavelength-converted light emitting system 200 according to a first embodiment of the invention is schematically illustrated in FIG. 2. The device 200 includes an electroluminescent device 202. In some cases, the electroluminescent device 202 can include a phosphorescent material capable of emitting light when absorbing electrical energy. In some cases, electroluminescent device 202 can include a semiconductor electroluminescent device such as a light emitting diode (LED) or a laser diode. An electroluminescent device in light emitting system 200 can be any device capable of emitting light in response to an electrical signal. For example, an electroluminescent device can be a light emitting diode (LED) capable of emitting photons in response to an electrical current as discussed in, for example, U.S. Patent Publication No. 2006/0124917, entitled "Adapting Short-Wavelength LED's for Polychromatic, Broadband, or 'White' Emission", incorporated herein by reference in its entirety.

In some cases the LED can include one or more p-type and/or n-type semiconductor layers, one or more active layers that may include one or more potential and/or quantum wells, buffer layers, substrate layers, and superstrate layers.

A semiconductor wavelength converter 204 is attached to the upper surface 206 of the electroluminescent device 202. The wavelength converter 204 is able to generate light at least two different wavelengths, λ1 and λ2, by converting light, at wavelength λp, received from the electroluminescent device 202. The wavelength converter 204 is formed in a stack that includes a first photoluminescent element 208 positioned, in the illustrated embodiment, closer to the electroluminescent device 202 than the second photoluminescent element 210.

A photoluminescent element is a structure that produces light at one characteristic wavelength when illuminated by light at another, generally shorter, characteristic wavelength. The photoluminescent element may be semiconductor material, but this is not a requirement. A photoluminescent element may also be referred to as a light converting element. The first photoluminescent element 208 generates light at λ1 when illuminated by light at λp from the electroluminescent device 202. The second photoluminescent element generates light at λ2 when illuminated by light at λp from the electroluminescent device 202. The two photoluminescent elements 208, 210 are separated by an etch-stop layer 212 and a window layer 214. Furthermore, a second window layer 216 may separate the first photoluminescent element 208 from the electroluminescent device 202.

An LED electroluminescent device can emit light at any wavelength that may be desirable in an application. For example, the LED can emit light at a UV wavelength, a visible wavelength, or an IR wavelength. In some cases, the LED can be a short-wavelength LED capable of emitting UV photons. In general, the LED and/or a light converting element (LCE) may be composed of any suitable materials, such as organic semiconductors or inorganic semiconductors, including Group IV elements such as Si or Ge; III-V compounds such as InAs, AlAs, GaAs, InP, AlP, GaP, InSb, AlSb, GaSb, GaN, AlN, InN and alloys of III-V compounds such as AlGaInP and AlGaInN; II-VI compounds such as ZnSe, CdSe, BeSe, MgSe, ZnTe, CdTe, BeTe, MgTe, ZnS, CdS, BeS, MgS and alloys of II-VI compounds, or alloys of any of the compounds listed above.

In some cases, an LED and/or the wavelength converter 204 can include CdMgZnSe alloys having compounds ZnSe, CdSe, and MgSe as the three constituents of the alloy. In some cases, one or more of Cd, Mg, and Zn, especially Mg, may have zero concentration in the alloy and therefore, may be absent from the alloy. For example, the LCE can include a $Cd_{0.70}Zn_{0.30}Se$ quantum well capable of emitting in the red, or a $Cd_{0.33}Zn_{0.67}Se$ quantum well capable of emitting in the green. As another example, the LED and/or the LCE can include an alloy of Cd, Zn, Se, and optionally Mg, in which case, the alloy system can be represented by Cd(Mg)ZnSe. As another example, the LED and/or the LCE can include an alloy of Cd, Mg, Se, and optionally Zn. In some cases, a quantum well LCE has a thickness in a range from about 1 nm to about 100 nm, or from about 2 nm to about 35 nm.

In some cases, a semiconductor LED or LCE may be n-doped or p-doped where the doping can be accomplished by any suitable method and by inclusion of any suitable dopant. In some cases, the LED and the LCE are from the same semiconductor group. In some cases, the LED and LCE are from two different semiconductor groups. For example, in some cases, the LED is a III-V semiconductor device and the LCE is a II-VI semiconductor device. In some cases, the LEDs include AlGaInN semiconductor alloys and the LCEs include Cd(Mg)ZnSe semiconductor alloys.

An LCE can be disposed on or attached to a corresponding electroluminescent device by any suitable method, such as by an adhesive. Some examples of adhesive include, but are not limited to, curable adhesives and hot melt adhesives. Other techniques such as welding, pressure, heat or any combinations of such methods may also be used. Examples of suitable hot melt adhesives include semicrystalline polyolefins, thermoplastic polyesters, and acrylic resins. In some cases, an LCE can be attached to a corresponding electroluminescent device by a wafer bonding technique. For example, the upper most surface of the electroluminescent device and the lower-most surface of the LCE can be coated with a thin layer of silica or other inorganic materials using, for example, a plasma assisted, conventional CVD, or other deposition process. Next, the coated surfaces can be optionally planarized and bonded using a combination of heat, pressure, water, or one or more chemical agents, for example in a polishing process such as chemical mechanical polishing, or lapping. The bonding can be improved by bombarding at least one of the coated surfaces with hydrogen atoms or by activating the surface using a low energy plasma. Wafer bonding methods are described in, for example, U.S. Pat. Nos. 5,915,193 and 6,563,133, and in chapters 4 and 10 of "Semiconductor Wafer Bonding" by Q.-Y. Tong and U. Gösele (John Wiley & sons, New York, 1999).

In some cases, a quantum or potential well LCE can have one or more light absorbing layers proximate the well to assist in absorbing light emitted from corresponding electroluminescent device. In some cases, the absorbing layers are composed of materials in which photogenerated carriers can efficiently diffuse to the potential well. In some cases, the light absorbing layers can include a semiconductor, such as an inorganic semiconductor. In some case, a quantum or potential well LCE can include buffer layers, substrate layers, and superstrate layers.

An electroluminescent device or an LCE can be manufactured by any suitable method. For example, a semiconductor electroluminescent device and/or LCE can be manufactured using molecular beam epitaxy (MBE), chemical vapor deposition (CVD), liquid phase epitaxy (LPE) or vapor phase epitaxy (VPE).

Each semiconductor photoluminescent element 208, 210 includes at least one layer for absorbing light at $\lambda p$ from the electroluminescent device 202, thus creating carrier pairs in the semiconductor, and at least one potential well layer, for example a quantum well layer, that collects the carriers, which recombine to emit light at a wavelength longer than $\lambda p$. The photoluminescent elements 208, 210 generate light at different wavelengths when illuminated by the light from the electroluminescent device 202.

A first region 218 of the electroluminescent device 202 is covered by only the second photoluminescent element 210. Light 220, having a wavelength $\lambda p$, from the first region 218 of the electroluminescent device 202 is incident on the second photoluminescent element 210 to generate light 222 at $\lambda 2$. The light 220 passes through a region 223 empty of epitaxially grown semiconductor material to reach the second photoluminescent element 210. The region 223 may be empty or may either be filled or partially filled with a non-epitaxial material, for example an inorganic or an organic non-epitaxial material. The non-epitaxial material preferably absorbs only a small amount of the light 220, if any. The second photoluminescent element 210 may absorb substantially all of the light 220 incident from the first region 218 of the electroluminescent device 202, or may only absorb part of the incident light 220.

A second region 224 of the electroluminescent device 202 is covered by only the first photoluminescent element 208. Light 226, having a wavelength $\lambda p$, from the second region 224 of the electroluminescent device 202 is incident on the first photoluminescent element 208, thus generating light 228 at $\lambda 1$. The first photoluminescent element 208 may absorb substantially all the light 226 incident from the second region 224 of the electroluminescent device 202.

In the illustrated embodiment, a third region 230 of the electroluminescent device 202 is not covered by either the first or second photoluminescent elements 208, 210. Thus light 232 at $\lambda p$ can pass directly out of the light generating system 200. It will be appreciated that the light from the electroluminescent device 202 propagates in a number of different directions, as does the light from the first and second photoluminescent elements 208, 210. Thus, the light 222, 228 and 232 at different wavelengths passes out of the light generating system 200 and becomes spatially mixed.

One exemplary device may include a GaN-based LED as the electroluminescent device 202, and so the light at $\lambda p$, e.g. light 220, 226 and 232 is blue. The first photoluminescent element 208 generates light 228 at a first converted wavelength, $\lambda 1$, and the second photoluminescent element 210 generates light 222 at a second converted wavelength, $\lambda 2$. In some embodiments the first converted wavelength, $\lambda 1$, is red while the second converted wavelength, $\lambda 2$, is green. Thus, the light generating system 200 may be capable of emitting light of all three colors, red, green and blue, that are used in a display. In other embodiments the first converted wavelength may be green while the second converted wavelength is red.

The wavelength converter 204 may be directly bonded to the electroluminescent device 202 or may optionally be attached using a bonding layer 234. The use of a bonding layer 234 is discussed in greater detail in PCT Application Serial No. US2008/075710, and filed on Sep. 9, 2008, claiming priority from U.S. Patent Application Ser. No. 60/978, 304, filed Oct. 8, 2007, and direct bonding of a wavelength converter 204 to an electroluminescent device is described in U.S. Patent Application Ser. No. 61/012,604, filed Dec. 10, 2007, all of which applications are incorporated herein by reference. Electrodes 236 and 238 may be provided on either side of the electroluminescent device 202 to provide a driving current. The light generating system 200 may also be provided with extraction features on one or more surfaces, for example as is discussed in PCT Application Serial No. US2008/075710, and being filed on Sep. 9, 2008, which claims priority from Provisional Patent Application Ser. No. 60/978,304, both of which applications are incorporated herein by reference. In other embodiments, the individual regions 218, 224, 230 of the LED may be individually addressable so that the color emitted by the system 200 is controllable.

While the invention does not limit the types of semiconductor material that may be used in the electroluminescent device and, therefore, the wavelength of light generated within the electroluminescent device, it is expected that the invention will be found to be useful at converting blue light. For example, an AlGaInN LED that produces blue light may be used with a wavelength converter that absorbs the blue light to produce red light and green light, with the resulting spatially mixed light appearing white.

One example of a multilayered wavelength converter that may be used with the light generating system 200 employs multilayered quantum well structures based on II-VI semiconductor materials, for example various metal alloy selenides such as CdMgZnSe. In such multilayered wavelength converters, the semiconductor wavelength converter is engineered so that the band gap in portions of the structure is set so that those portions absorb at least some, if not all or almost all, of the pump light emitted by the electroluminescent device. The charge carriers generated by absorption of the pump light diffuse into quantum well layers, which are engineered to have a smaller band gap than the absorbing regions. The carriers recombine in the quantum well layers and generate light at a longer wavelength than the pump wavelength. This description is not intended to limit the types of semiconductor materials or the multilayered structure of the wavelength converter.

Figure 3:
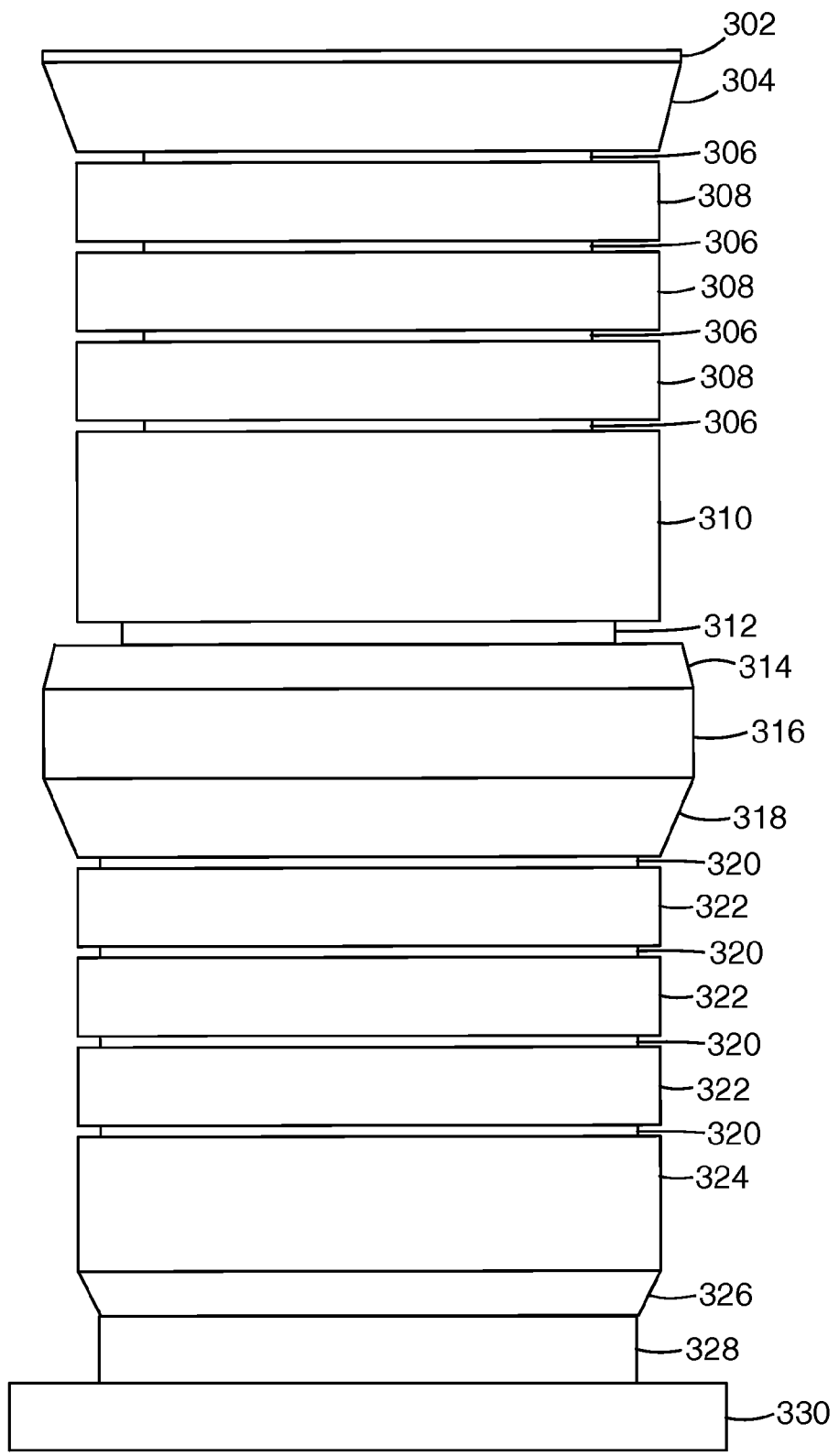
FIG. 3 schematically illustrates an embodiment of a semiconductor wavelength converter, according to principles of the present invention.

The band structure of an exemplary semiconductor layered wavelength converter 300 is schematically illustrated in FIG. 3. The wavelength converter may be epitaxially grown, for example using molecular beam epitaxy (MBE) or some other epitaxial technique. The different layers of the converter 300 are shown as an epitaxial stack, with the width of each layer being qualitatively representative of the value of the layer's bandgap. The layered semiconductor wavelength converter 300 may be grown on an InP substrate, although other types of semiconductor substrates may be used. A summary of the thickness, material, and bandgap for the various layers in an exemplary wavelength converter is presented in Table I below.

TABLE I

Summary of Exemplary Wavelength Converter Structure

| Layer no. | Description | Material | Thickness (μm) | Bandgap (eV) |
| --- | --- | --- | --- | --- |
| 302 | Bottom window | CdMgZnSe | 0.05 | 2.92 |
| 304 | Bandgap grading | CdMgZnSe | 0.22 | 2.92-2.48 |
| 306 | Red quantum well | CdZnSe | 0.0057 | 1.88 (emit at 1.96) |
| 308 | Absorber for red quantum well | CdMgZnSe:Cl | 0.12 | 2.48 |
| 310 | Absorber for red quantum well | CdMgZnSe:Cl | 0.64 | 2.48 |
| 312 | Etch-stop layer | CdZnSe | 0.1 | 2.1 |
| 314 | Bandgap grading | CdMgZnSe | 0.15 | 2.48-2.92 |
| 316 | Middle window | CdMgZnSe | 0.35 | 2.92 |
| 318 | Bandgap grading | CdMgZnSe | 0.22 | 2.92-2.48 |
| 320 | Green quantum well | CdZnSe | 0.0023 | 2.13 (emit at 2.25) |
| 322 | Absorber for green quantum well | CdMgZnSe:Cl | 0.12 | 2.48 |
| 324 | Absorber for green quantum well | CdMgZnSe:Cl | 0.5 | 2.48 |
| 326 | Graded absorber | CdMgZnSe | 0.13 | 2.48-2.35 |
| 328 | Buffer layer | GaInAs | 0.2 | Lattice matched to InP |
| 330 | Substrate | InP | | |

A window layer is a semiconductor layer that is designed to be transparent to at least some of the light incident on the window layer. The bottom window layer 302 is the layer that is attached to the LED. A graded layer is one whose composition changes from one side to the other so as to provide a smooth transition in the band gap between adjacent layers. In the exemplary structure, the layer composition of the graded layer is changed by altering the relative abundances of Cd, Mg and Zn. A photoluminescent element includes a stack of absorbing layers alternating with potential well layers. Thus, the red photoluminescent element includes layers 306, 308 and 310, while the green photoluminescent element includes layers 320, 322 and 324. The etch-stop layer 312 is a layer that resists etching by the etchant used to etch the red photoluminescent element, so that the etchant does not reach the green photoluminescent element.

It will be appreciated that different variations of this structure may be used. For example, different layer thicknesses and material compositions may be used. Also, the positions of the red-emitting photoluminescent element and the green-emitting photoluminescent element may be interchanged so that the substrate is closer to the red-emitting photoluminescent element instead of the green-emitting photoluminescent element. In other embodiments, the position of the etch stop layer, or layers, and the window layers may be different within the stack, depending on the particular application.

One approach to fabricating an embodiment of a light generating system that includes a dual-wavelength, layered semiconductor converter attached to an LED is now discussed with reference to FIGS. 4A-4F. While the process is explained in general terms, the specific examples refer back to the dual wavelength converter described with reference to FIG. 3. FIGS. 4A-4F schematically illustrate a cross-section through a part of a wavelength converted light generating system as discussed above. The process steps discussed with regard to FIGS. 4A-4F may take place at the device level, but may also take place at the wafer level. Wafer-level processing provides advantages of bulk processing.

Figure 4A:
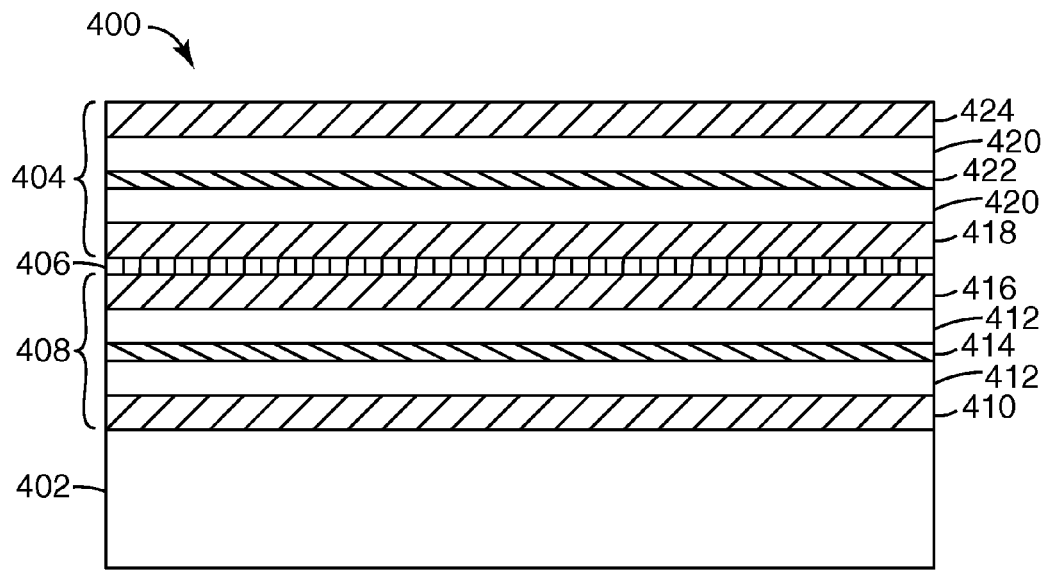
FIGS. 4A-4H schematically illustrate fabrication steps in the fabrication of one embodiment of a wavelength-converted light emitting system.
Figure 4B:
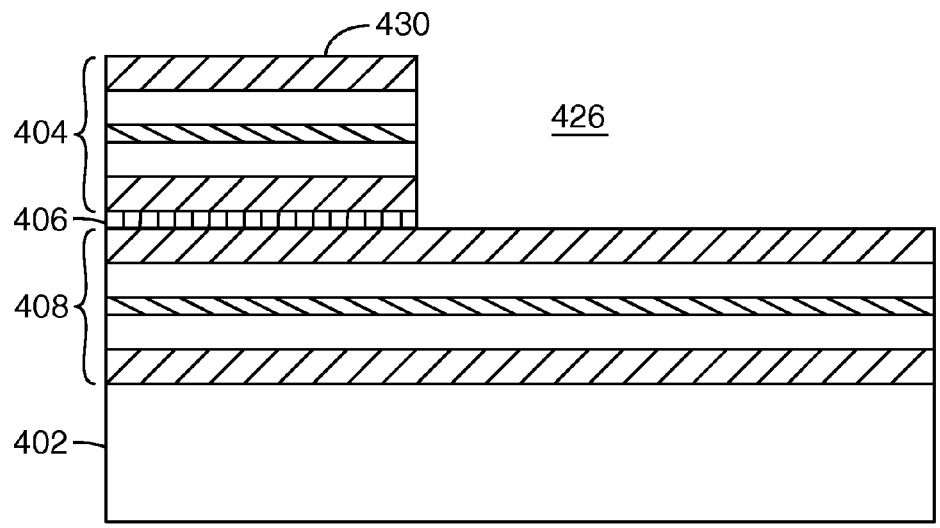

First, the stack of photoluminescent elements may be fabricated using conventional epitaxial growth techniques on a substrate, to produce a dual wavelength converter wafer 400, as schematically shown in FIG. 4A. The dual wavelength converter wafer 400 includes a substrate 402, typically growth substrate on which the subsequent layers are grown, a first photoluminescent element 404 for converting light to a first converted wavelength, an etch stop layer 406 and a second photoluminescent element 408 for converting light to a second converted wavelength. In some embodiments the wavelength converter is used to convert blue light from a pump source. In such a case, the first and second converted wavelengths are often selected to be green and red wavelengths respectively, or may be red and green respectively. It will be understood that this description is for illustration purposes only and is not intended to limit the actual pump wavelengths, nor the first and second converted wavelengths.

The second photoluminescent element 408 includes a lower window layer 410 next to the substrate 402 and an alternating arrangement of first absorbing layers 412 and first quantum well layers 414. The illustrated embodiment shows only one first quantum well layer 414 for simplicity, although it will be appreciated that more first quantum well layers 414, and concomitant first absorbing layers 412, may be employed. The second photoluminescent element 408 may be topped off with an upper window layer 416 next to the etch stop layer 406.

In this embodiment, the first photoluminescent element 404 includes a lower window layer 418 next to the etch stop layer 406 and an alternating arrangement of second absorbing layers 420 and second quantum well layers 422. The illustrated embodiment shows only one second quantum well layer 422 for simplicity, although it will be appreciated that more second quantum well layers 422, and concomitant second absorbing layers 420, may be employed. The first photoluminescent element 404 may be topped off with an upper window layer 424. Other arrangements of the different layers may be used.

Various regions 426 of the first photoluminescent element 404 may be removed, in some embodiments by using various lithographic techniques. For example the region 426 may be removed by etching the first photoluminescent element 404 up to the etch stop layer 406 using a suitable etchant. In the particular example of wavelength converter described above with reference to FIG. 3, the first photoluminescent element 404 includes CdMgZnSe layers, in which case the etchant may be, for example, a solution containing HCl or HBr.

The first photoluminescent element 404 is designed to convert absorbed light to the first converted wavelength, which property may be used to monitor the etching process. The etch region 426 of the first photoluminescent element 404 may be illuminated with light that is absorbed in the first photoluminescent element 404 and the resulting converted light at the first converted wavelength detected while the process of etching is taking place. The light generated at the first converted wavelength may be detected by eye or by using any suitable detector, for example by a photodetector coupled with a filter or spectrum analyzer to reject light that is not at the first converted wavelength. The amount of light generated at the first converted wavelength falls off when the quantum wells 422 of the first photoluminescent element 404 have been removed from the etch region 426. When the first photoluminescent element 404 is fully etched in region 426, the etch rate will slow or substantially stop at the surface of the etch-stop layer 406, to produce the etched wafer schematically shown in FIG. 4B.

In the specific example of the dual wavelength converter of FIG. 3, the first converted wavelength is green and the second converted wavelength is red. The etch region 426 is illuminated with blue or UV light from an LED, laser or other suitable light source, and the green converted light from the first photoluminescent element 404 is detected. The etch-stop layer 406 fluoresces orange, so the emission of the green converted light ceases when the quantum wells of the first photoluminescent element 404 are removed from the etch region 426.

The wafer 400 may then be rinsed before etching the etch-stop layer 406 in the etch region 426. The etch-stop layer 406 in the etch region 426 may then be removed using a second etchant. The etching process may be followed by monitoring the fluorescence of light from the etch-stop layer 406 resulting from illumination of the etch-stop layer 406 as it is being etched. Where the spectrum of the fluorescent light generated by the etch-stop layer 406 is different from the spectrum of the light generated by the underlying middle window layer or the second photoluminescent element 408 when illuminated by the light source, the fall off in fluorescence from the etch-stop layer 406 can be detected when the etch-stop layer 406 has been removed from the etch region 426. At this point the etching process can be halted, to produce the wafer schematically illustrated in FIG. 4B. Depending on the wavelength of light being used to illuminate the etch region 426, the illumination light either generates fluorescent light in the window layer 416 or generates light at the second converted wavelength in the second photoluminescent element 408.

In the particular example of the dual wavelength converter of FIG. 4, the etch-stop layer 406 is formed of chlorine-doped CdZnSe and the second etch may be, for example, a solution of $HBr/H_2O/Br_2$. In some embodiments the volume ratio of the components of the etch 240/40/1, although other ratios may also be used. The CdZnSe etch-stop layer 406 may be illuminated with the same blue or UV light used to illuminate the first photoluminescent element 404. When the illumination light is at or close to the same wavelength as light generated by the LED to which the wavelength converter is to be attached, the middle window 416 is substantially transparent to the illumination light and so light at the first converted wavelength is generated by the second photoluminescent element 408 once the etch-stop layer 406 has been removed by etching. Accordingly, the etching process can be halted once the wavelength of the fluorescent light has changed from the color of the etch-stop layer fluorescence to that of the second converted wavelength.

It will be appreciated that other techniques for material removal, including dry etch techniques such as reactive ion etching, ion milling and laser ablation may also be used to remove material. Some of these techniques may not require an etch stop layer, in which case the etch stop layer may be omitted, and the etching process carefully controlled to terminate at a window layer between the two wavelength converters.

Figure 4C:
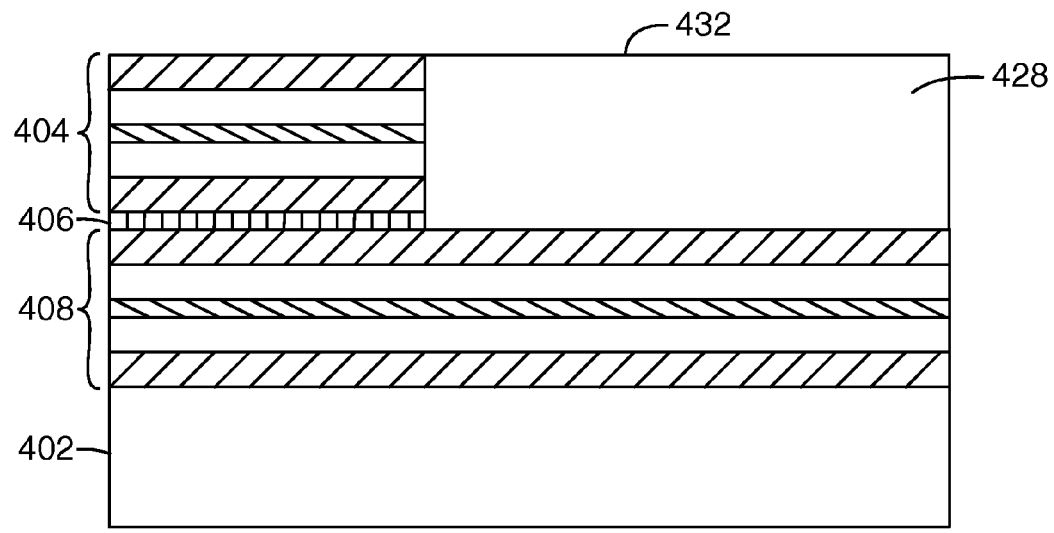
Figure 4D:
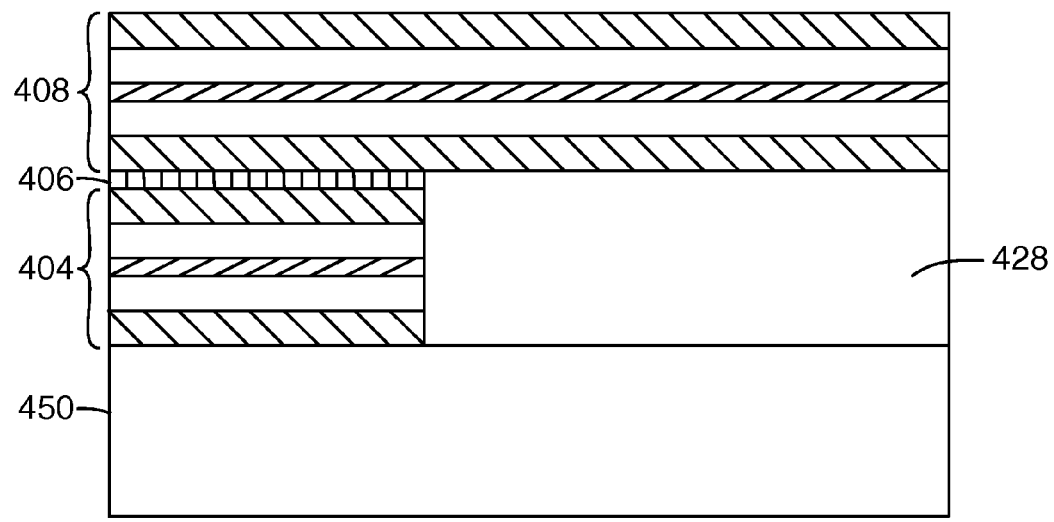

The etched regions 426 may then be filled with a first passivation layer 428 which may be planarized to be level with the top of the first photoluminescent element 404, as is schematically illustrated in FIG. 4C. Many different types of material are suitable for the first passivation layer 428. For example, some examples of suitable inorganic passivation materials include metal oxides, metal nitrides or metal oxynitrides. Some specific examples include silicon oxide, silicon oxynitride (SiON) and silicon nitride, ZnS, $Al_2O_3$ and $TiO_2$. Some examples of suitable organic passivation materials include self-assembled monolayers, reactive organic monomers or polymers, thermoplastics, thermosets, or waxes. Many of the bonding materials discussed in PCT Application Serial No. US2008/075710 may also be suitable as organic passivation materials. Particularly useful organic passivation materials may include benzocyclobutenes, silicon containing polymers and parylene materials. The passivation layer 428 may also include more than one passivation material. One advantage of inorganic materials is that they tend to provide better moisture barriers than organic materials. On the other hand, layers of organic materials tend to grow faster than inorganic materials. The passivation layer 428 may include layers of more than one type of passivation material. For example, the passivation layer 428 may include a layer of an inorganic material layer as a moisture barrier and a layer of an organic layer for faster layer growth. The passivation layer 428 may be grown using standard microfabrication techniques, such as vacuum deposition, spin-coating, plasma-enhanced chemical vapor deposition (PECVD), sputtering, dispensing and the like. The passivation layer 428 may also be planarized using standard microfabrication techniques, such as chemical-mechanical polishing, lapping and etching.

The wavelength converter wafer 400 may then be attached to the wafer of an electroluminescent device, e.g. an LED wafer 450. This may be done by bonding the upper surface 430 of the etched wafer from FIG. 4B, or the planarized surface 432 of the etched wafer from FIG. 4C, to the upper surface of the LED wafer 450. The wavelength converter wafer 400 may be bonded to the LED wafer 450 using any suitable technique, for example by adhesive bonding, as is discussed in U.S. Patent Application Ser. No. 60/978,304 and PCT Application Serial No. US2008/075710, or by direct bonding, as is discussed in U.S. Patent Application Ser. No. 61/012,604. In some cases the bonding layer may be a portion of the passivation material. The substrate 402 may then be removed, for example by etching, to produce the wavelength converted LED wafer structure shown in FIG. 4D. In the example of the dual wavelength converter of FIG. 3, the substrate 402 is InP and can be removed by etching in a solution of $3HCl:1H_2O$. A buffer layer of GaInAs (not shown) between the InP substrate 402 and the second photoluminescent element 408 can be removed using an etchant of 40 g adipic acid: 200 ml $H_2O$: 30 ml $NH_4OH$: 15 ml $H_2O_2$, to expose the window layer 410. In the illustrated embodiment the first photoluminescent element 404 is attached to the LED wafer 450 and the second photoluminescent element 408 is positioned further away from the LED wafer 450. All etchant components are used in their maximum concentration unless otherwise noted.

Figure 4E:
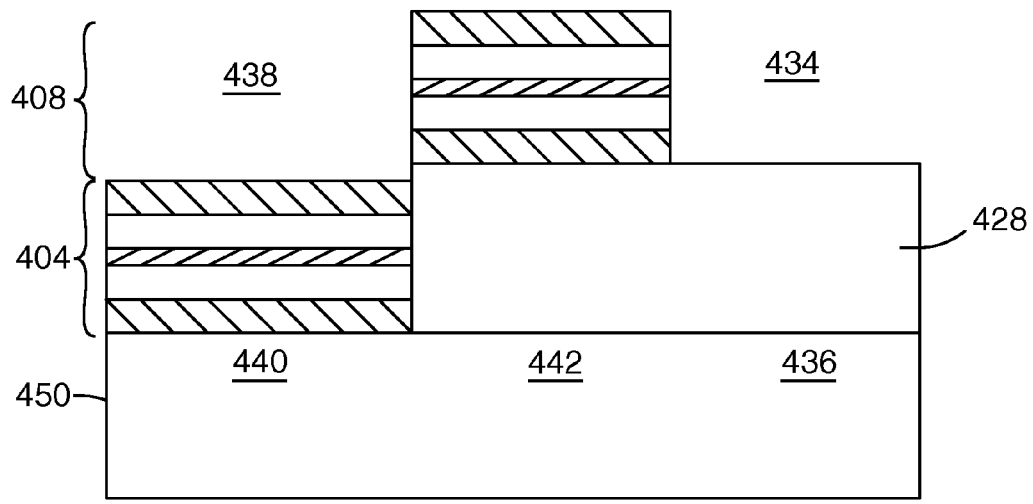

Certain portions of the second photoluminescent element 408 may now be etched, as is described with reference to FIG. 4E. For example, one or more regions 434 of the second photoluminescent element 408 above the first passivation layer 428 may etched, removing the second photoluminescent element so that there remains no wavelength converter above the region 436 of the LED wafer 450. In addition, one or more regions 438 above the first photoluminescent element 404 may be etched so that there remains no second photoluminescent element 408 above the first photoluminescent element 404. Additionally, the remaining etch stop layer 406 may be removed from above the first photoluminescent element 404. Thus, there remains only one photoluminescent element 404 above the region 440 of the LED wafer 450 and only one photoluminescent element 408 above the region 442 of the LED wafer 450. The second photoluminescent element 408 may be etched using an etchant similar to that described above for etching the first photoluminescent layer. The different regions 436, 440, 442 of the LED wafer 450 may be individually addressable, thus affording the user control over the color of light emitted by the light generating system that uses the wavelength converted LED wafer 450.

Figure 4F:
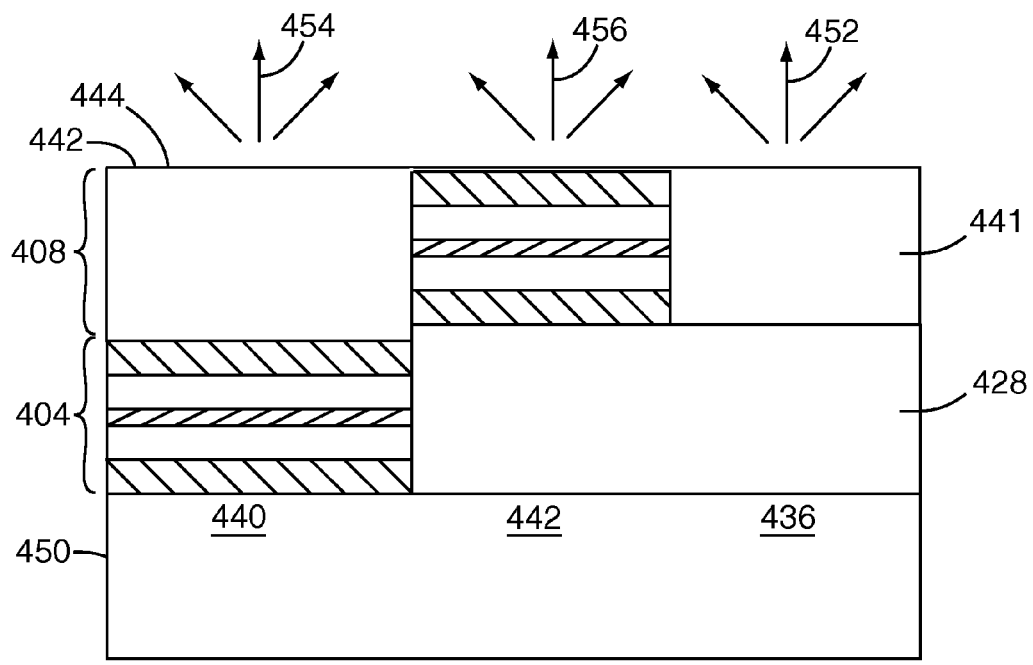

A second passivation layer 441 may be positioned over the areas 434, 438 where the second photoluminescent element 408 was removed, as is schematically illustrated in FIG. 4F. Like the first passivation layer 428, the second passivation layer 441 may be formed by organic material, inorganic material or a combination of both organic and inorganic material. In addition, the upper surface 444 of the second passivation layer 441 may be planarized, for example using a chemical mechanical polishing technique, to provide a flat surface. The planarized surface 444 may be used for mating the wavelength converted wafer to other optical elements used, for example, to collect the light emitted by the system.

Thus, light 452 at the pump wavelength is substantially emitted from region 436 of the LED wafer 450, while light 454 at the first converted wavelength 454 is substantially emitted above region 440 of the LED wafer 450 and light 456 at the second converted wavelength is substantially emitted above region 442 of the LED wafer 450. It will be appreciated, however that due to the distributed volume over which light is generated, in both the LED wafer 450 and the photoluminescent elements 404 and 408, and due to the wide angular range over which light at the three different wavelengths propagates, there may be some crossover. For example, light of one wavelength may be emitted above a region of the light generating system that primarily emits light of another color.

Figure 4G:
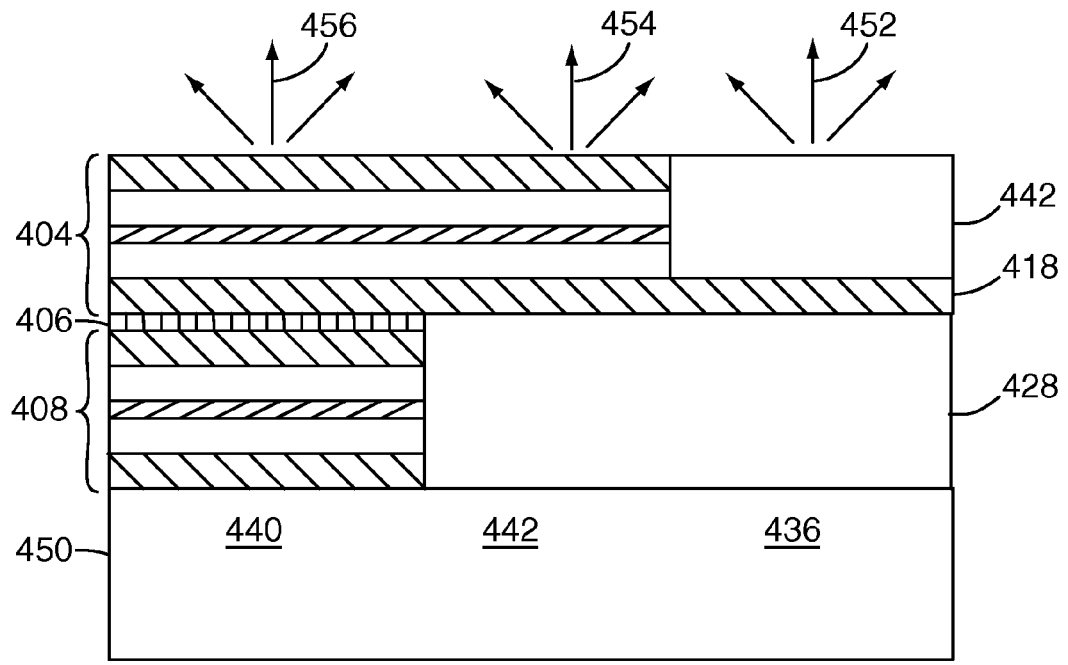
Figure 4H:
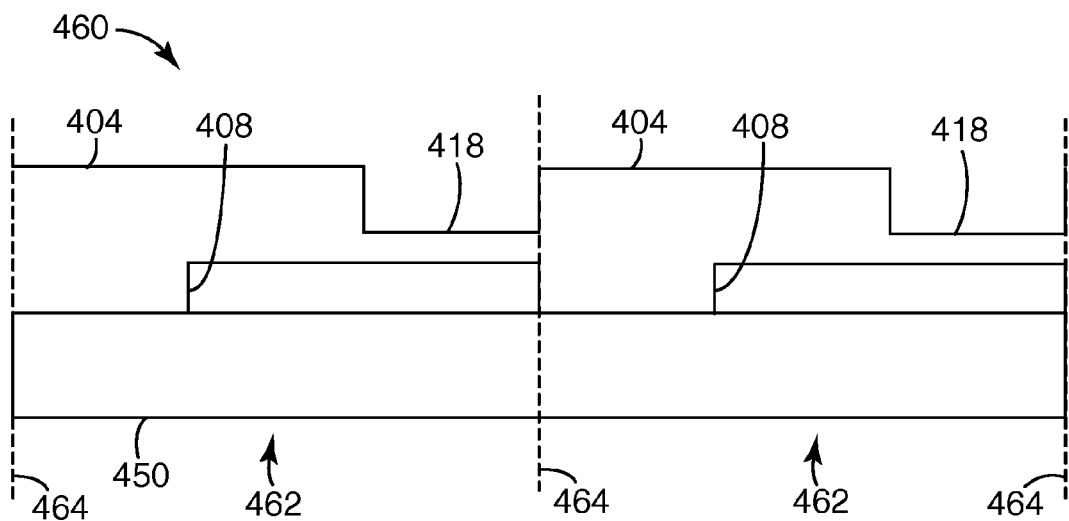

In the embodiment just described with reference to FIGS. 4A-4F, the photoluminescent element that generates the shorter converted wavelength is positioned closer to the electroluminescent element. This is not a necessary requirement, and another possible configuration is one in which the photoluminescent element that generates the longer converted wavelength is positioned closer to the electroluminescent element. An example of this configuration is schematically illustrated in FIG. 4G, which shows a wavelength converter having first and second photoluminescent elements 404, 408 attached to an LED substrate 450. The second photoluminescent element 408 is positioned closer to the LED substrate 450 than the first photoluminescent element 404. In this example, the second photoluminescent element 408 produces light 456 at the second converted wavelength which is longer in wavelength than the light 454 at first converted wavelength produced by the first photoluminescent element 404. For the illustrated configuration, the wavelength of the light at the second converted wavelength is too long to be absorbed by the first photoluminescent element 404, and so the light 456 at the second converted wavelength passes out through the first photoluminescent element 404 lying above the second photoluminescent element.

Furthermore, it is not necessary to completely remove the region of the wavelength converter wafer that covers the portion of the LED wafer 450 that generates the pump light transmitted out of the light generating system. To illustrate, in the exemplary embodiment shown in FIG. 4G, a portion of a window layer 418 covers the region 436 of the LED wafer 450 that emits the pump light 452.

In FIGS. 4A-4G, the illustrative cross-sectional views are restricted laterally and show only one area that produces pump light, light at the first converted wavelength and light at the second converted wavelength. It will be appreciated that, at the wafer level, many such areas may be involved. For example, where the light generating system is used in a full color projection display, one or more areas capable of generating each color may together be considered a pixel, with the smallest sized pixel incorporating just one independent area for each of the three colors. Thus, FIGS. 4A-4G may be considered as illustrating just one pixel of many. Neighboring regions on the wafer may be addressable independently, thus constituting different pixels. One exemplary cross-section through of a wafer, schematically illustrated in FIG. 4H extends the lateral view of the wavelength converted light generating system 460 across two pixels 462, separated by dashed lines 464.

In the example discussed above with reference to FIGS. 4A-4H, the wavelength converter is transferred from one substrate, typically the growth substrate, to the LED after one side of the wavelength converter has been etched. The second side of the wavelength converter is then etched after bonding to the LED wafer. Both sides of the wavelength converter are etched in this process. In some situations it may be desirable to transfer a wavelength converter that has been etched on one side to an intermediate substrate for etching on a second side, rather than to the LED wafer. The wavelength converter may be attached to an intermediate substrate, for example, so that the converter can be etched on both sides by the converter manufacturer before being shipped to a second party that integrates the double-etched converter wafer with the LED wafer.

Figure 5A:
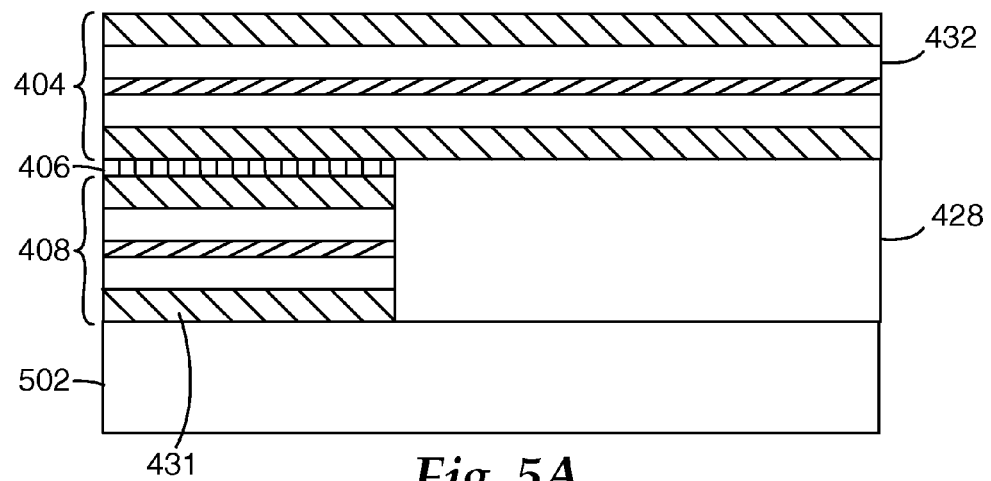
FIG. 5A-5D schematically illustrate different fabrication steps in the fabrication of an embodiment of a wavelength-converted light emitting system.
Figure 5B:
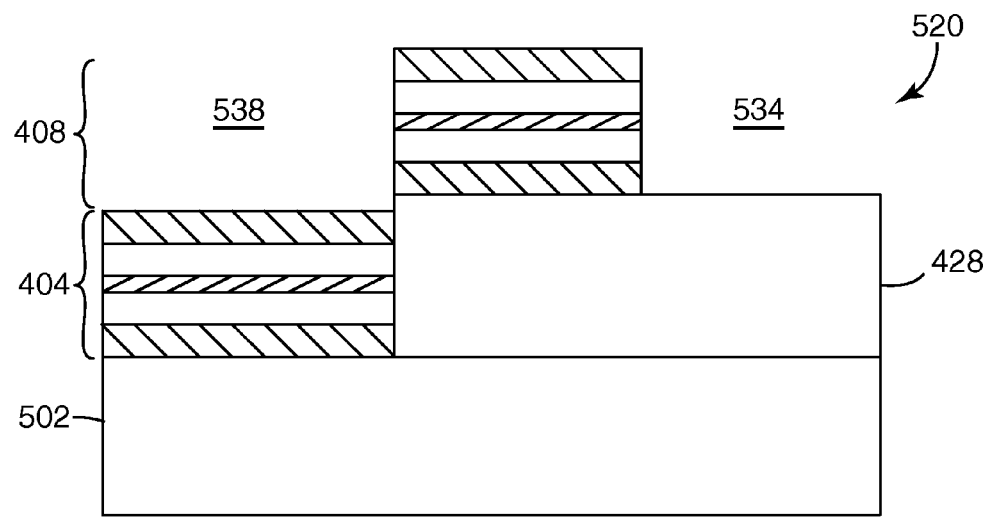
Figure 5C:
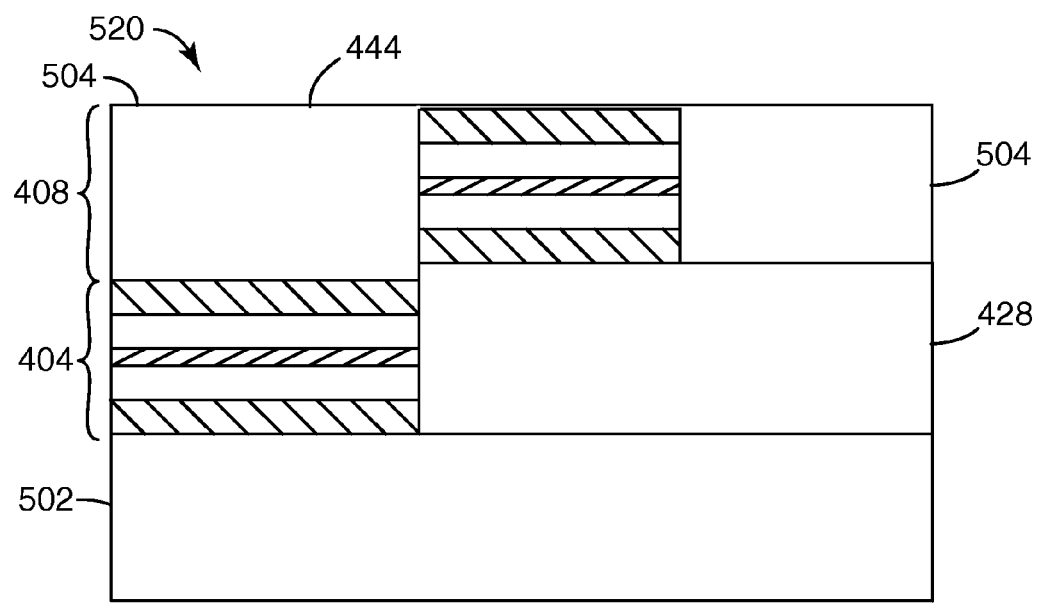
Figure 5D:
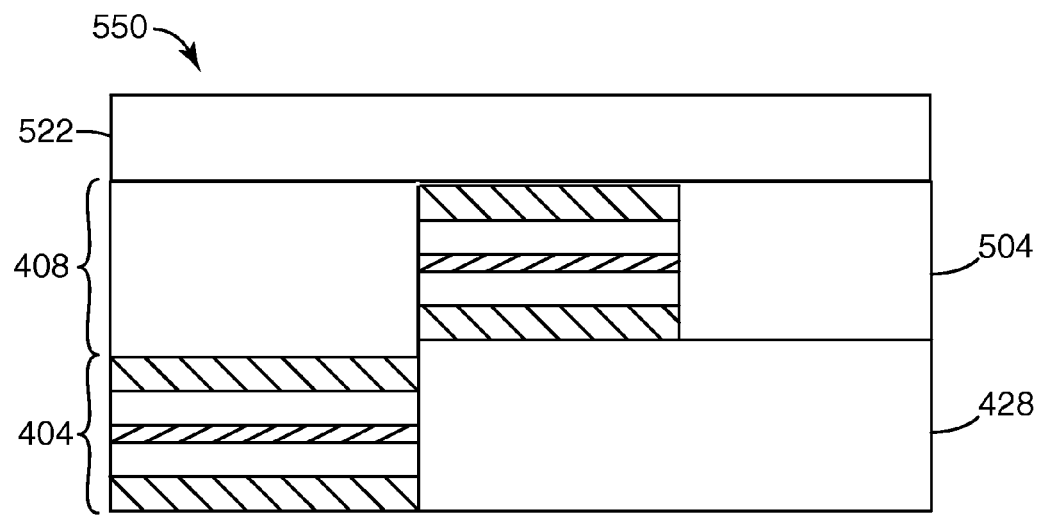

Some exemplary process steps in this approach are now discussed with regard to FIGS. 5A-5D. The description of the approach starts with the etched converter as shown in FIG. 4C: process steps leading up to this point have already been discussed. The upper surface 432 of the etched converter wafer 431 is attached to an intermediate substrate 502, as shown in FIG. 5A, and the substrate 402 removed. Different regions 534, 538 of the second photoluminescent element 408 may be removed, for example by etching, as shown in FIG. 5B, and a second planarization layer 504 deposited over the etched regions 434, in a manner similar to that described above, as shown in FIG. 5C. This leads to a wavelength converter 520 that is double-sided etched and mounted to an intermediate substrate 502, suitable for shipping. The etched wavelength converter 520 may also be provided with a protective layer e.g. of wax, photoresist, protective tapes for shipping. The intermediate substrate 502 may be formed of any suitable material including, but not limited to, glass, ceramic, semiconductor, or plastic.

The upper surface 444 of the etched wavelength converter 520 may subsequently be attached to an LED wafer 522, using an adhesive layer or direct bonding as has already been described, or using any other suitable method. The intermediate substrate 502 may then be removed, resulting in the light generating system 550 schematically illustrated in FIG. 5D, in which an LED wafer 522 is attached to a wavelength converter wafer that has been etched on both sides.

It will be appreciated that the devices shown in FIGS. 4A-4F and 5A-5D schematically represent the devices at various intermediate stages of fabrication, and are not supposed to represent exact cross-sections of intermediate devices. Different material removal techniques may result in non-vertical sidewalls in the etched region. One practical aspect of wet-etching, for example, is that the etching process tends not to produce vertical walls but to produce sidewalls that curve into the etched region as the sidewall gets deeper. Consequently, etched regions in a practical device do not necessarily have the vertical sidewalls shown in FIGS. 4B-4F and 5A-5D, but have sidewalls that are curved, with the resultant semiconductor structure being narrower at its top than at its base. Other material removal techniques may shape the sidewalls the other way, so that the resultant semiconductor structure is broader at its top than at its base. Also, other material removal techniques may make sidewalls that are sloped and straight, rather than curved. Also, it should be noted that the final shape of the sidewall, straight or curved, may be dependent on the material being etched and the composition of the etchant.

Figure 6A:
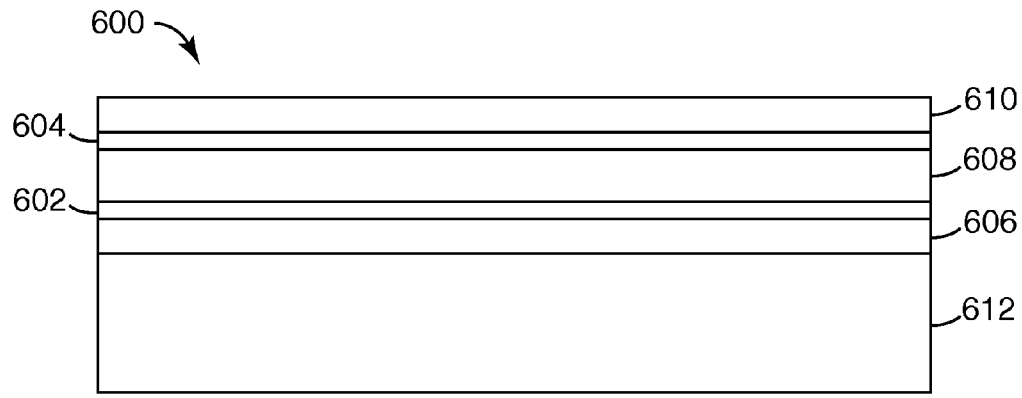
FIGS. 6A-6E schematically illustrate fabrication steps in which the wavelength converter has non-vertical etched sidewalls, according to principles of the present invention.
Figure 6B:
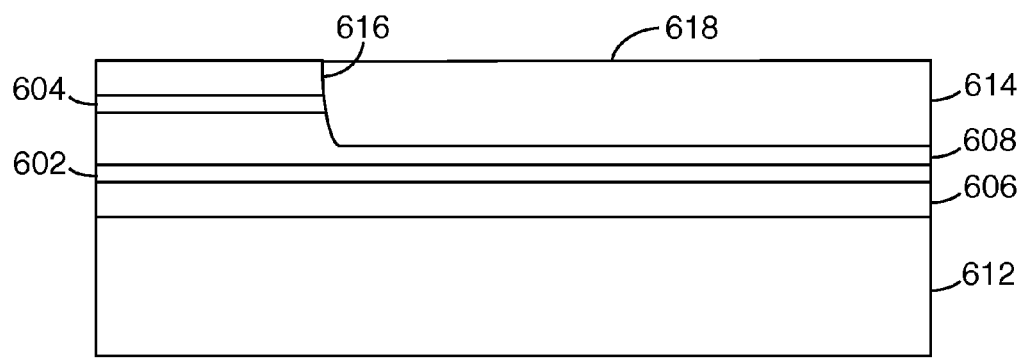
Figure 6C:
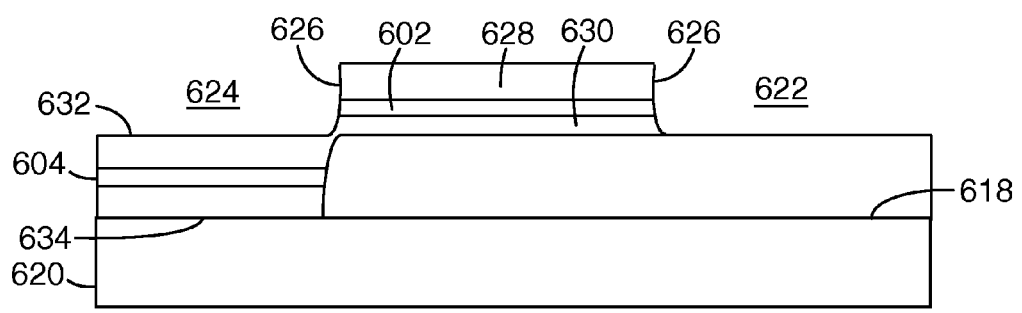

One example of a wavelength converter having a curved sidewall, as might be formed, for example, using a wet etch, is schematically shown in FIGS. 6A-6C. In this example, a wavelength converter wafer 600, comprising first and second photoluminescent elements 602, 604 including window layers 606, 608, 610, is attached to a substrate 612, as is schematically shown in FIG. 6A. It will be appreciated that the converter wafer 600 may have a more complex structure, but etch stop layers and other layers are omitted from the figure for simplicity.

A portion of the second photoluminescent element 604 is removed, e.g. by etching, and the etched portion is filled in with a first passivation layer 614, which may be planarized to produce planarized surface 618, as is schematically illustrated in FIG. 6B. The sidewall 616 of the second photoluminescent element 604 formed by the etching process shows curving into the etched region as the sidewall 616 becomes deeper. The amount of curve of the sidewall 616 is exaggerated in the figure for clarity. As a result, the unetched portion of the photoluminescent element 604 is narrower at the side that was originally exposed to the etchant when the etching process commenced than at the side facing away from the etch. In other words, the unetched portion is narrower at its top than at its root.

The planarized surface 618 may then be attached to a second substrate 620, which may be an LED wafer or an intermediate substrate, or some other substrate, and the first substrate 612 removed, leaving the second photoluminescent element 604 disposed intermediate the first photoluminescent element 602 and the second substrate. Various regions of the first photoluminescent element 602 may now be removed, e.g. via etching. In the example shown in FIG. 6C, regions 622 and 624 are etched to remove portions of the first photoluminescent element 602. Again, the etched sidewalls 626 are curved, so that the remaining portion of the first photoluminescent element 602 is narrower at the top 628, the part further away from the substrate 620, and narrower at the bottom, 630, closer to the substrate 620. The top 632 of the second photoluminescent element 604, further from the substrate 620, however, is wider than the bottom 634 of the second photoluminescent element 604, closer to the substrate 620. The fact that the widths of the two photoluminescent elements 602, 604 vary in different directions relative to the substrate 620 is attributable to the fact that the wavelength converter was etched from each side. Regions 622 and 624 may be filled in with a passivation layer.

Figure 6D:
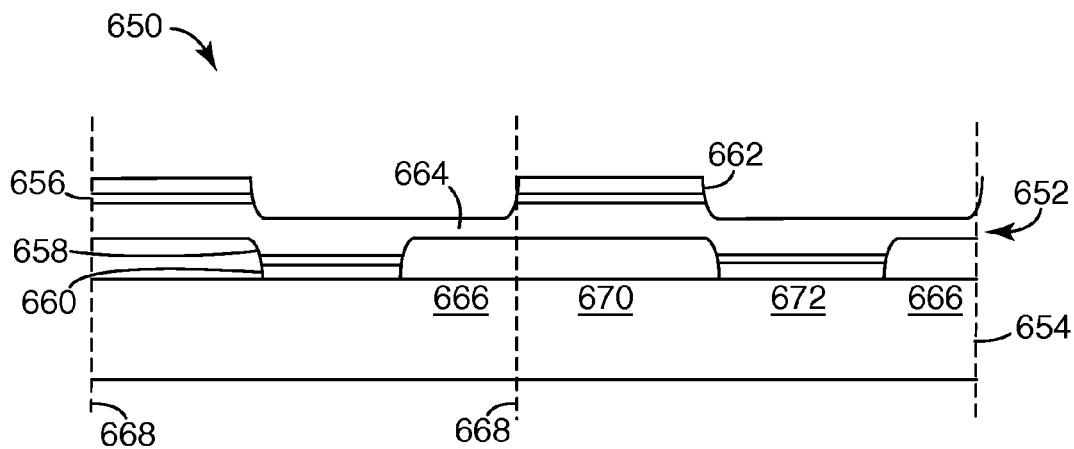

A cross-sectional view of another exemplary embodiment of a light generating device 650 is schematically illustrated in FIG. 6D. The device 650 includes a wavelength converter 652, having first and second photoluminescent elements 656 and 658, attached to a LED wafer 654. The wavelength converter 652 has been patterned on both sides. In the illustrated embodiment the side of the wavelength converter 652 facing the LED wafer 654 includes the second photoluminescent element 658 and the side of the wavelength converter 652 facing away from the LED wafer 654 includes the first photoluminescent element 656. The second photoluminescent element 658 is patterned with one or more structures 660 that become narrower in the direction towards the LED wafer 654. In other words the top of the structure 660 is narrower than the base of the structure 660. The first photoluminescent element 656 is patterned with one or more structures 662 that become narrower in a direction away from the LED wafer 654. In other words, the top of the structure 662 is narrower than the base of the structure 662. The term "top" here refers to that part of the structure further away from the center of the semiconductor stack, and the term "base" refers to that part of the structure that is closer to the center of the stack.

In this embodiment, a window layer 664 lies between the photoluminescent elements 656, 658 and, in this embodiment, stretches across regions of the LED wafer 654 such as regions 666 that are not covered by either the first or second photoluminescent elements 656, 658. The illustrative view of the exemplary device 650 shows two pixels, separated by the dashed lines 668, although it will be appreciated that a wafer may contain many pixels.

It should also be noted that the size of the different areas producing different colors need not all be the same. For example, in the illustrated embodiment the lateral width of the region 666, which emits light at the wavelength of the LED, is narrower than the lateral width of the regions 670 and 672 below the first and second photoluminescent elements 656 and 658 respectively. The widths of these separate regions may be selected in order to achieve a particular color balance. For example, if the light emitted from region 672, at one color, were to appear to a viewer to be not as bright as the light emitted from region 666, at a second color, when the two regions 666 and 672 were of the same width, it may be desirable to reduce the width of region 666 and increase the width of region 672 so that the two regions appear to the viewer to be of the same brightness.

Figure 6E:
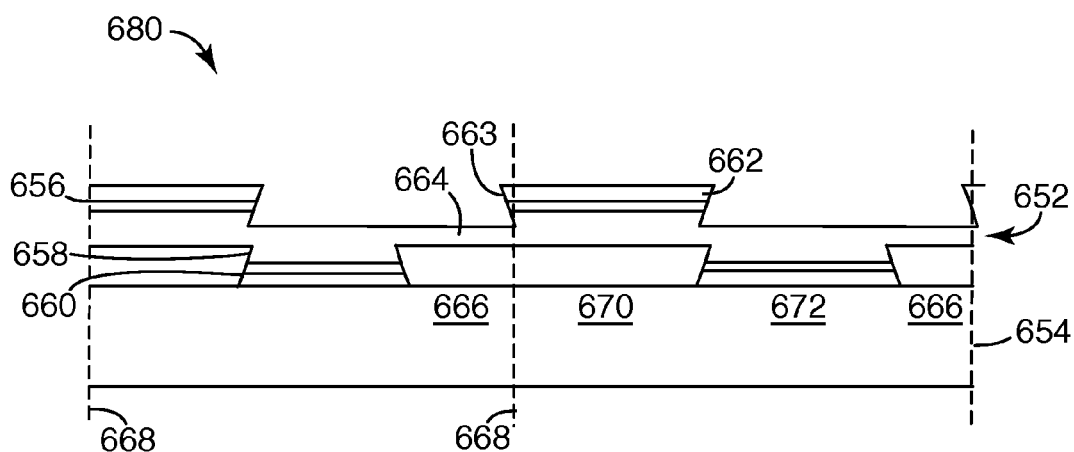

In some other embodiments, the top of the structure 660 may be broader than the base of the structure 660, and the top of the structure 662 broader the base of the structure 662, for example as is schematically illustrated in FIG. 6E for the wavelength-converted light source 680. In the embodiment the sidewalls 663 are straight, but in other embodiments may be curved.

In some cases, a light converting element may include a slab phosphor. For example the well known phosphor, Ce:YAG can be made into a slab by sintering Ce:YAG phosphor particles at elevated temperatures and pressures to form a substantially optically transparent and non-scattering slab. Details of the fabrication are described in, for example, U.S. Pat. No. 7,361,938, incorporated herein by reference. Exemplary phosphors that may be used in a light converting element include strontium thiogallates, doped GaN, copper-activated zinc sulfide, and silver-activated zinc sulfide. Other useful phosphors include doped YAG, silicate, silicon oxynitride, silicon nitride, and aluminate based phosphors. Examples of such phosphors include Ce:YAG, SrSiON:Eu, SrBaSiO:Eu, SrSiN:Eu, and BaSrSiN:Eu.

Multiple phosphor slab layers with different compositions or dominant emission wavelengths can be stacked together by co-sintering. In other cases, separate phosphor slabs may be bonded together using an adhesive, thermoplastic, sol-gel, or other bonding materials. In some embodiments, the bonding material may have substantially different solubility characteristics from the phosphor slab in order to act as an etch stop.

Figure 7:
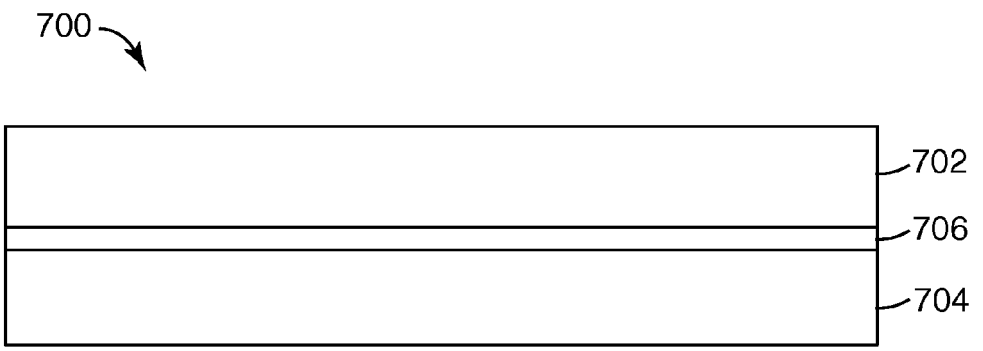
FIG. 7 schematically illustrates an embodiment of a layered wavelength converter that includes two photoluminescent elements according to principles of the present invention.

Layered wavelength converters capable of converting to multiple colors may be formed using one or more semiconductor photoluminescent elements and/or one or more slab phosphor photoluminescent elements. An exemplary embodiment of a layered multiwavelength converter 700 is schematically illustrated in FIG. 7, in which layer 702 is a first photoluminescent element, layer 704 is a second photoluminescent element and layer 706 is an optional bonding layer. Either of the first and second photoluminescent elements 702, 704 may be semiconductor photoluminescent elements, or may be slab phosphor photoluminescent elements.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices. For example, while the above description has discussed GaN-based LEDs, the invention is also applicable to LEDs fabricated using other III-V semiconductor materials, and also to LEDs that use II-VI semiconductor materials.

We claim:

1. A light generating device comprising:
   an electroluminescent element having an output side; and
   a semiconductor wavelength converter having a first side and a second side, the wavelength converter being attached to the output side of the electroluminescent element, the wavelength converter having a first etched pattern on the first side and a second etched pattern on the second side,
   wherein the wavelength converter comprises first and second photoluminescent elements, each of the first and second photoluminescent elements comprising a plurality of cadmium zinc selenide (CdZnSe) quantum wells disposed between absorbing layers of cadmium magnesium zinc selenide (CdMgZnSe).

2. A light emitting device, comprising:
   an electroluminescent device capable of emitting light at a pump wavelength;
   a wavelength converter attached to the electroluminescent device, the wavelength converter comprising at least a first photoluminescent element and a second photoluminescent element patterned on a single semiconductor layer stack, the first and second photoluminescent elements capable of emitting light at first and second wavelengths respectively when illuminated by light at the pump wavelength, the first photoluminescent element substantially overlying a first region of the electroluminescent device and substantially not overlying a second region of the electroluminescent device, the second photoluminescent element substantially overlying the second region of the electroluminescent device and substantially not overlying the first region of the electroluminescent device,
   wherein the first and second photoluminescent elements each comprise a plurality of cadmium zinc selenide (CdZnSe) quantum wells disposed between absorbing layers of cadmium magnesium zinc selenide (CdMgZnSe).

* * * * *